United States Patent
Zhang et al.

(10) Patent No.: US 9,315,379 B2
(45) Date of Patent: Apr. 19, 2016

(54) METHODS OF FORMING MEMS DEVICE

(71) Applicant: Shanghai Huahong Grace Semiconductor Manufacturing Corporation, Shanghai (CN)

(72) Inventors: Zhenxing Zhang, Shanghai (CN); Pei Xi, Shanghai (CN); Lei Xiong, Shanghai (CN); Jianpeng Wang, Shanghai (CN); Ting Shi, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/575,271

(22) Filed: Dec. 18, 2014

(65) Prior Publication Data

US 2015/0259198 A1     Sep. 17, 2015

(30) Foreign Application Priority Data

Mar. 17, 2014   (CN) .......................... 2014 1 0097373

(51) Int. Cl.
  *H01L 21/311*  (2006.01)
  *B81C 1/00*    (2006.01)

(52) U.S. Cl.
  CPC ......... *B81C 1/00396* (2013.01); *B81C 1/00849* (2013.01)

(58) Field of Classification Search
  CPC .............................................. H01L 2924/1461
  USPC .......................................................... 438/702
  See application file for complete search history.

(56) References Cited

U.S. PATENT DOCUMENTS

| 2007/0279971 | A1* | 12/2007 | Vogt ....................... G11C 11/16 365/158 |
| 2009/0275694 | A1* | 11/2009 | Baldwin-Hendricks C08G 77/04 524/588 |
| 2015/0259198 | A1* | 9/2015  | Zhang ................. B81C 1/00587 438/702 |

\* cited by examiner

*Primary Examiner* — Elias M Ullah
(74) *Attorney, Agent, or Firm* — Muncy, Geissler, Olds & Lowe, P.C.

(57) ABSTRACT

A method of forming a micro-electro-mechanical systems (MEMS) device includes: providing a substrate; forming a tantalum nitride (TaN) layer on the substrate; forming a dielectric anti-reflective coating (DARC) layer on the TaN layer; coating photoresist on the DARC layer and etching the DARC: and TaN layers to form a trench; performing intensified ashing and wet cleaning processes to remove the photoresist and the DARC layer. The DARC layer can prevent the formation of tantalum-containing polymeric substances from a reaction between the TaN layer and the photoresist during the intensified ashing process.

10 Claims, 4 Drawing Sheets

METHODS OF FORMING MEMS DEVICE

CROSS-REFERENCES TO RELATED APPLICATIONS

This application claims the priority of Chinese patent application number 201410097373.5, filed on Mar. 17, 2014, the entire contents of which are incorporated herein by reference.

TECHNICAL FIELD

The present invention relates generally to micro-electromechanical systems (MEMS), and in particular, to methods of forming a MEMS device.

BACKGROUND

MEMS devices are micro-machined devices or systems, generally of a micron or nanometer size and incorporating integrated micro-sized sensors, actuators, signal processors, control circuitry and other like components. Thanks to their small size, lightweight, low power consumption, low price, reliable performance and other advantages, MEMS devices have found extensive use in a variety of applications.

MEMS is a new high-end technology emerging in recent years and developing rapidly. Based on advanced semiconductor fabrication technology, MEMS devices can be massively produced with well-controlled production costs and high product consistency. Typical fabrication process of MEMS devices is a micromachining process that involves film deposition, photolithography, epitaxy, oxidation, diffusion, injection, sputtering, evaporation, etching, dicing, packaging and other necessary steps for fabricating complex three-dimensional structures.

In general, an MEMS device fabrication process involves forming a trench by etching. As a width of the trench is a crucial parameter for the performance of the MEMS device, the trench width needs to be strictly controlled. Currently, the trench width is generally required to be controlled in a range from 0.2 µm to 0.5 µm. FIG. 1 schematically shows a resulting structure after the formation of a trench 16 in a conventional method for fabricating a MEMS device 10. As illustrated, the MEMS device 10 includes a substrate 11, a nickel-iron (NiFe) layer 12 overlying the substrate 11, a tantalum nitride (TaN) layer 13 overlying the NiFe layer 12, and the trench 16 in the TaN layer 13. In this structure, after the trench 16 is formed, ashing and wet cleaning processes are further involved to remove an anti-reflective coating layer 14 and photoresist 15, both disposed over the TaN layer 13.

With further reference to FIG. 1, in the conventional fabrication method of the MEMS device 10, the trench 16 is formed principally by the following steps: providing the substrate 11; successively forming the NiFe and TaN layers 12 and 13 on the substrate 11; sequentially coating the anti-reflective coating layer 14 and the photoresist 15 on the TaN layer 13, wherein the anti-reflective coating layer 14 is implemented as a bottom anti-reflective coating (BARC) layer that underlies the photoresist 15 and can reduce the reflection of exposure light for a better absorption of the exposure energy in the photoresist 15; etching the TaN layer 13 to form the trench 16; and performing the ashing and wet cleaning processes to remove the anti-reflective coating layer 14 and the photoresist 15.

However, in the course of conventional ashing processes, the TaN layer 13 tends to react with the photoresist 15 and produces a large amount of tantalum-containing polymeric substances which cover the photoresist 15 and BARE layer and impede the removal thereof This will cause a large amount of photoresist 15 and BARC residues in the trench 16, which is detrimental to the performance of the MEMS device being fabricated.

The above said residues covered by the tantalum-containing polymeric substances are difficult to be removed by conventional ashing processes which use pure oxygen ($O_2$) under the temperature of 250° C. In addition, although conventional intensified ashing processes using a low temperature mixture of carbon tetrafluoride ($CF_4$) and $O_2$ are capable of removing the residues, it tends to simultaneously broaden the trench beyond the control width limit, and in a severe situation, may cause peeling of the TaN layer near the trench. Such undesired scenarios will all adversely affect the performance of the MEMS device being fabricated.

Therefore, there is an urgent need in this art for a solution to address the performance degradation of the conventional MEMS devices caused by the photoresist and BARC residues generated in the etching process for forming the trench.

SUMMARY OF THE INVENTION

It is therefore an objective of the present invention to provide methods of forming a MEMS device to address the above described problem.

In accordance with this objective, a method of the present invention includes the following steps in the sequence set forth: providing a substrate; forming a tantalum nitride layer on the substrate; forming a dielectric anti-reflective coating layer on the tantalum nitride layer; coating a photoresist on the dielectric anti-reflective coating layer and performing a photolithographic process to form a photoresist pattern; sequentially etching the dielectric anti-reflective coating layer and the tantalum nitride layer to form a trench by using the photoresist pattern as an etching mask; and performing an intensified ashing process and a wet cleaning process to remove the photoresist pattern and the dielectric anti-reflective coating layer, wherein the dielectric anti-reflective coating layer prevents the tantalum nitride layer from reacting with the photoresist to form tantalum-containing polymeric substances during the intensified ashing process.

Optionally, the dielectric anti-reflective coating layer may be formed of silicon oxynitride.

Optionally, the dielectric anti-reflective coating layer may be formed by a chemical vapor deposition process.

Optionally, the method may further include forming a nickel-iron layer on the substrate prior to forming the tantalum nitride layer.

Optionally, the nickel-iron layer and the tantalum nitride layer may be both formed by a physical vapor deposition process.

In accordance with aforementioned objective, another method of the present invention includes the following steps in the sequence set forth: providing a substrate; forming a tantalum nitride layer on the substrate; forming a dielectric anti-reflective coating layer on the tantalum nitride layer; forming a bottom anti-reflective coating layer on the dielectric anti-reflective coating layer; coating a photoresist on the bottom anti-reflective coating layer and performing a photolithographic process to form a photoresist pattern; sequentially etching the bottom anti-reflective coating layer, the dielectric anti-reflective coating layer and the tantalum nitride layer to form a trench using the photoresist pattern as an etching mask; and performing an intensified ashing process and a wet cleaning process to remove the photoresist pattern, the bottom anti-reflective coating layer and the dielectric anti-reflective coating layer, wherein the dielectric anti-reflective coating layer prevents the tantalum nitride layer from reacting with the photoresist to form tantalum-containing polymeric substances during the intensified ashing process.

Optionally, the dielectric anti-reflective coating layer may be formed of silicon oxynitride.

Optionally, the dielectric anti-reflective coating layer may be formed by a chemical vapor deposition process.

Optionally, the method may further include forming a nickel-iron layer on the substrate prior to forming the tantalum nitride layer.

Optionally, the nickel-iron layer and the tantalum nitride layer may be both formed by a physical vapor deposition process.

Advantageously, by forming a dielectric anti-reflective coating layer on the tantalum nitride layer, the tantalum nitride layer is isolated from the photoresist and is hence prevented from reacting therewith to form tantalum-containing polymeric substances during the intensified ashing process. Therefore, the methods of the present invention can address the problem of photoresist and bottom anti-reflective coating residues generated due to the blocking effect of the tantalum-containing polymeric substances while maintaining a width of the trench during the intensified ashing process.

DETAILED DESCRIPTION

The methods of forming an MEMS device according to the present invention will be described in greater detail with reference to the following description of exemplary embodiments, taken in conjunction with the accompanying drawings. Features and advantages of the invention will be apparent from the following detailed description, and from the claims. It is noted that all the drawings are presented in a very simple form and not drawn precisely to scale. They are provided solely to facilitate the description of the exemplary embodiments in a convenient and clear way.

Embodiment 1

Figure 1:
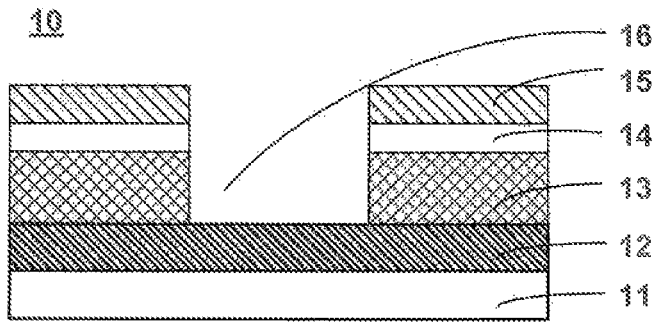
FIG. 1 is a schematic showing a resulting structure after forming a trench in a conventional method for fabricating a MEMS device.
Figure 2:
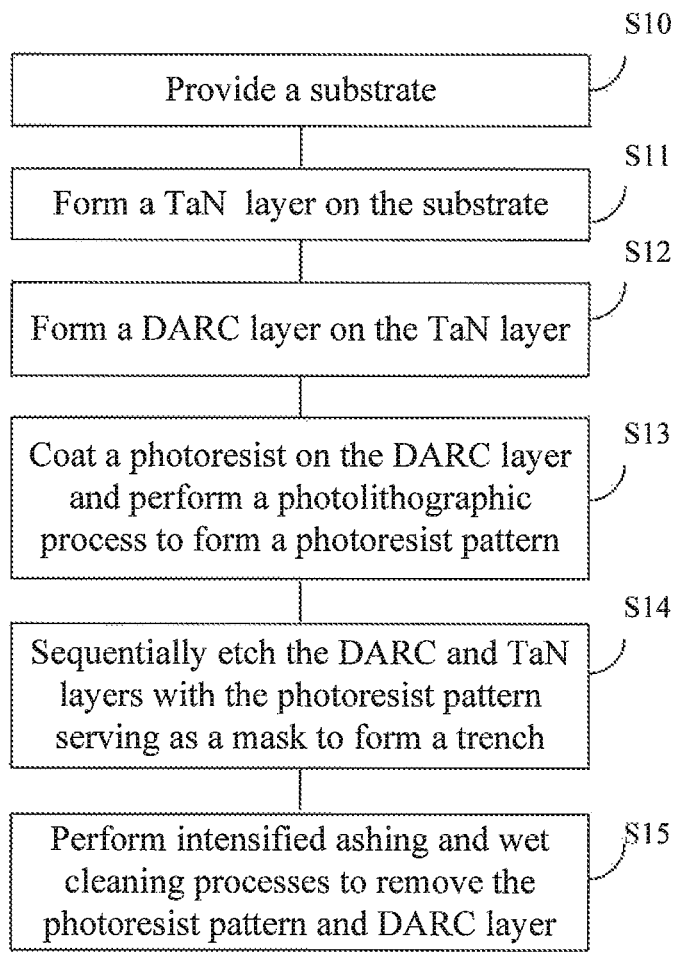
FIG. 2 depicts a flowchart graphically illustrating a method of forming an MEMS device in accordance with Embodiment 1 of the present invention.
Figure 3:
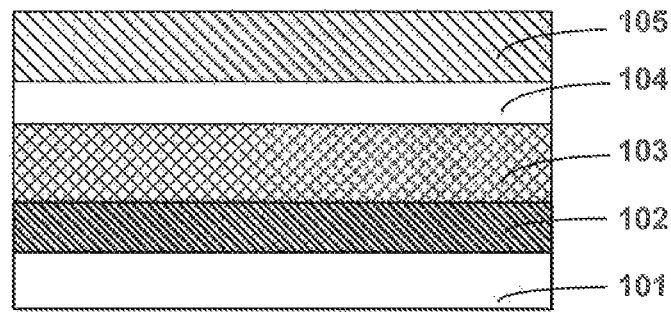
FIG. 3 shows a resulting structure after the application of a photoresist in the method in accordance with Embodiment 1 of the present invention.
Figure 4:
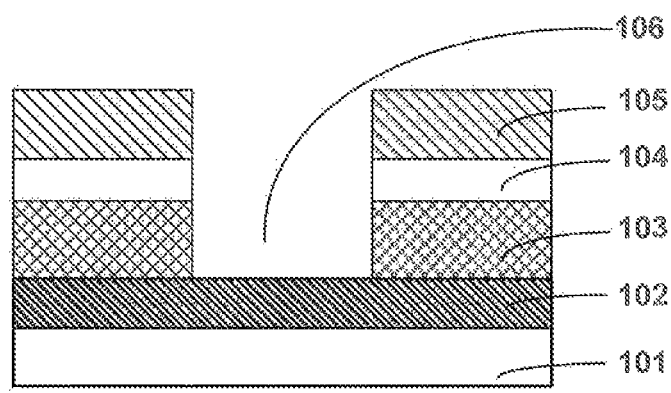
FIG. 4 shows a resulting structure after forming a trench in the method in accordance with Embodiment 1 of the present invention.
Figure 5:
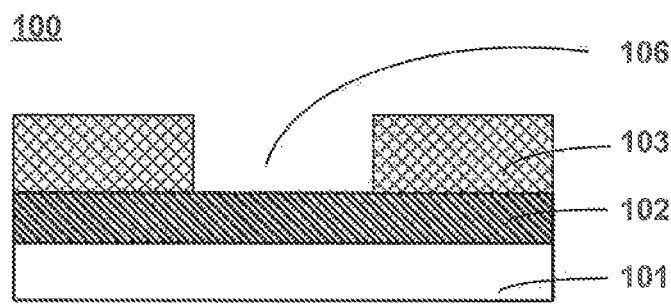
FIG. 5 shows a resulting structure after ashing process and wet cleaning processes are performed in the method in accordance with Embodiment 1 of the present invention.

Referring to FIG. 2, in conjunction with FIGS. 3 to 5, a method of forming an MEMS device 100 in accordance with Embodiment 1 includes the following steps:

S10) providing a substrate 101;

S11) forming a tantalum nitride (TaN) layer 103 on the substrate 101;

S12) forming a dielectric anti-reflective coating (DARC) layer 104 on the TaN layer 103;

S13) coating a photoresist 105 on the DARC layer 104 and performing a photolithographic process to form a photoresist pattern;

S14) sequentially etching the DARC layer 104 and the TaN layer 103 to form a trench 106 by using the photoresist pattern as a mask; and S15) performing intensified ashing and wet cleaning processes to remove the photoresist pattern and the DARC layer 104, wherein the DARC layer 104 prevents the TaN layer 103 from reacting with the photoresist 105 to form tantalum-containing polymeric substances during the intensified ashing process.

In particular, referring to FIG. 3, as an initial part of the overall process, the substrate 101 is provided, selectively as a semiconductor substrate such as an n-type, p-type or silicon on insulator (SOI) substrate. Before the TaN layer 103 is formed, a PVD process may be performed to form a nickel-iron (NiFe) layer 102 on the substrate 101, wherein the NiFe layer 102 serves as an etch stop layer in a subsequent step for etching the TaN layer 103. Afterward, another PVD process is performed to form the TaN layer 103 over the surface of the NiFe layer 102.

As with the TaN layer 103 formed, the DARC layer 104 is formed thereon by a chemical vapor deposition (CVD) process. When disposed beneath the photoresist 105, the DARC layer 104 can facilitate the absorption of exposure energy in the photoresist 105 by reducing the reflection of exposure light therefrom. In this embodiment, the DARC layer 104 is formed of silicon oxynitride (SiON).

The DARC layer 104 is then coated with the photoresist 105, thereby resulting in a structure shown in FIG. 3, wherein the substrate 101 is stacked with the NiFe layer 102, the TaN layer 103, the DARC layer 104 and the photoresist 105, in this order.

With Reference to FIG. 4, once the photoresist 105 is coated, a photolithographic process is performed to transfer a desired pattern therein. The pattern is then further transferred into the DARC layer 104 by etching away a portion of the DARC layer 104 that needs to be removed to form the pattern and thus exposing the underlying TaN layer 103. The exposed portion of the TaN layer 103 is then further etched until the NiFe layer 102 is exposed to form the trench 106.

Referring again to FIG. 4, which shows a resulting structure after forming the trench 106 in the method in accordance with this embodiment. As illustrated, after the trench 106 is formed by the above described photolithographic and etching processes and prior to the subsequent ashing and wet cleaning processes, the TaN layer 103 is still covered by the DARC layer 104 and the photoresist 105.

With the trench 106 formed, the intensified ashing and wet cleaning processes are performed on the MEMS device 100. The intensified ashing process can accelerate the peeling of the photoresist 105 and may be conducted with a mixture of $CF_4$ with a concentration of 40 sccm and $O_2$ with a concentration of 1500 sccm introduced at a temperature of 80° C. to 130° C. In the process, the DARC layer 104 covering the TaN layer 103 can block the photoresist 105 from reacting with the underlying TaN layer 103 to produce tantalum-containing polymeric substances. Therefore, there is no such substance generated throughout the whole ashing process.

FIG. 5 shows a resulting structure after the completion of the ashing and wet cleaning processes in the method in accordance with this embodiment. As illustrated, without the blocking of tantalum-containing polymeric substances, the DARC layer 104 is smoothly removed after the removal of the photoresist 105. Further, due to the protection from the overlying DARC layer 104, the TaN layer 103 is not affected by the ashing process and the trench 106 thus maintains its width.

Practical tests have proven that the width of the trench 106 formed by the method in accordance with this embodiment is controlled in the range of 0.2 μm to 0.5 μm, meeting the requirement.

Embodiment 2

Figure 6:
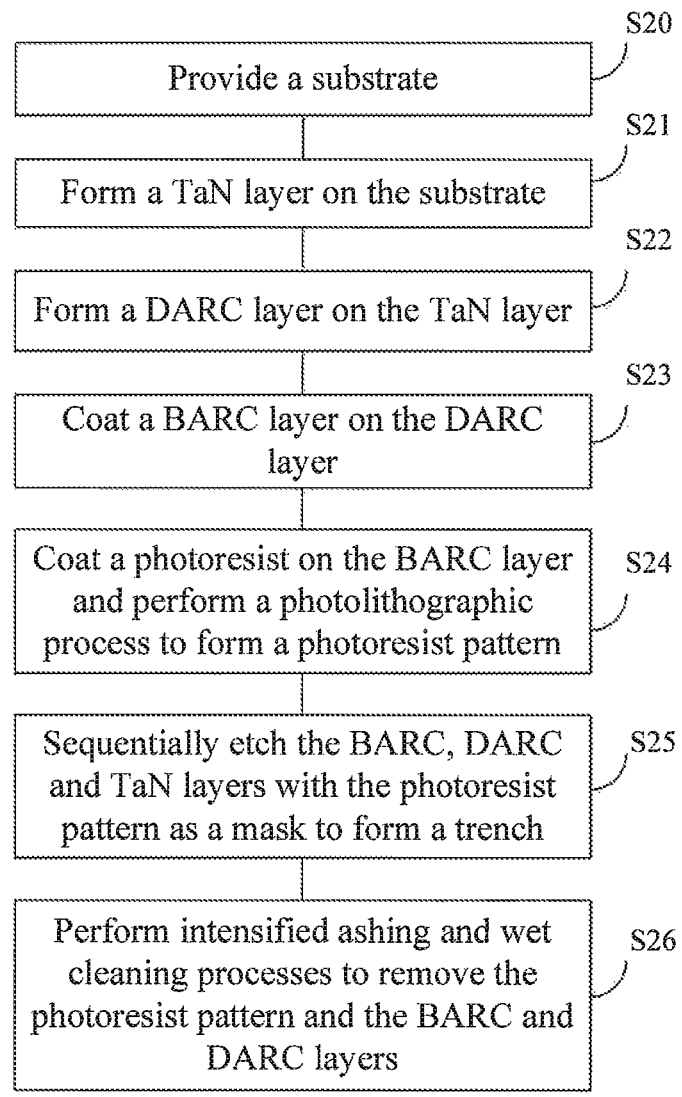
FIG. 6 depicts a flowchart graphically illustrating a method of forming an MEMS device in accordance with Embodiment 2 of the present invention.
Figure 7:
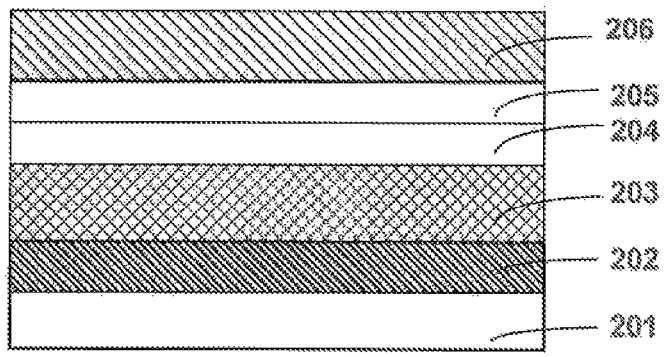
FIG. 7 shows a resulting structure after the application of a photoresist in the method in accordance with Embodiment 2 of the present invention.
Figure 8:
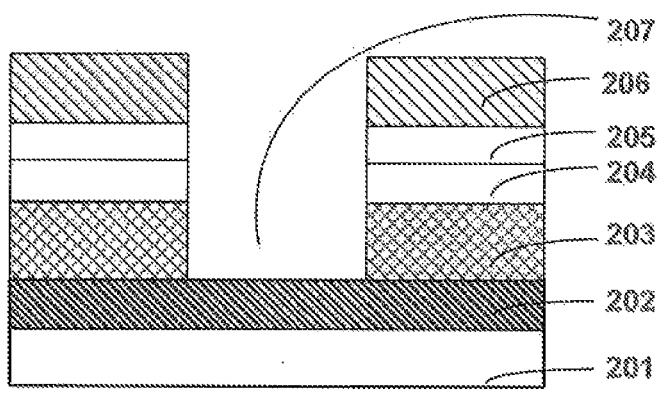
FIG. 8 shows a resulting structure after forming a trench in the method in accordance with Embodiment 2 of the present invention.
Figure 9:
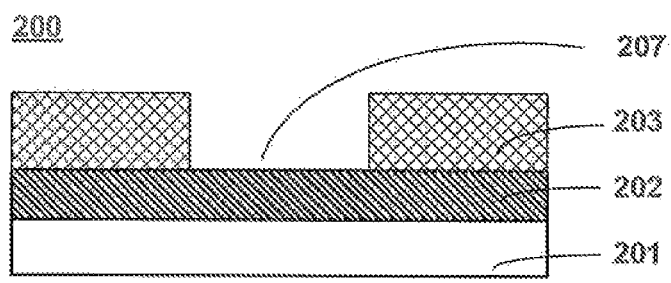
FIG. 9 shows a resulting structure after ashing process and wet cleaning processes are performed in the method in accordance with Embodiment 2 of the present invention.

Referring to FIG. 6, in conjunction with FIGS. 7 to 9, a method for forming an MEMS device 200 in accordance with Embodiment 2 includes the following steps:

S20) providing a substrate 201;

S21) forming a TaN layer 203 on the substrate 201;

S22) forming a DARC layer 204 on the TaN layer 203;

S23) coating a bottom anti-reflective coating (BARC) layer 205 on the DARC layer 204;

S24) coating a photoresist 206 on the BARC layer 205 and performing a photolithographic process to form a photoresist pattern in the photoresist 206;

S25) sequentially etching the BARC, DARC and TaN layers 205, 204 and 203 to form a trench 207 by using the photoresist pattern as an etching mask; and S26) performing intensified ashing and wet cleaning processes to remove the photoresist pattern, the BARC layer 205 and the DARC layer 204, wherein the DARC layer 204 prevents the TaN layer 203 from reacting with the photoresist 206 to form tantalum-containing polymeric substances during the intensified ashing process.

In particular, referring to FIG. 7, as an initial part of the overall process, the substrate 201 is provided, selectively as a semiconductor substrate such as an n-type, p-type or SOI substrate. Prior to the formation of the TaN layer 203, a NiFe layer 202 may be performed on the substrate 201 by PVD, wherein the NiFe layer 202 serves as an etch stop layer in a subsequent step for etching the TaN layer 203.

After that, the TaN layer 203 is formed also by PVD, above the substrate 201 and covering the surface of the NiFe layer 202.

As with the TaN layer 203 formed, the DARC layer 204 is formed thereon by CVD. When disposed beneath the photoresist 206, the DARC layer 204 can facilitate the absorption of exposure energy in the photoresist 206 by reducing the reflection of exposure light therefrom. In this embodiment, the DARC layer 204 is implemented as a SiON layer.

Referring again to FIG. 7, the BARC layer 205 is subsequently coated on the DARC layer 204. In this embodiment, the structure with the BARC layer 205 stacked between the DARC layer 204 and the photoresist 206 allows precise control over the width of the trench 207 during formation of the trench by etching, which can contribute to performance improvement of the device being fabricated.

Once the BARC layer 205 is formed, the photoresist 206 is coated thereon, thus resulting in a structure shown in FIG. 7, wherein the substrate 201 is stacked with the NiFe layer 202, the TaN layer 203, the DARC layer 204, the BARC layer 205 and the photoresist 206, in this order.

With Reference to FIG. 8, after the application of the photoresist 206, a photolithographic process is performed to transfer a desired pattern in both the photoresist 206 and the underlying BARC layer 205. The pattern is then further transferred into the DARC layer 204 by etching away a portion of the DARC layer 204 that needs to be removed to form the pattern and thus exposing the underlying TaN layer 203. The exposed portion of the TaN layer 203 is then further etched until the NiFe layer 202 is exposed to form the trench 207.

Referring again to FIG. 8, which shows a resulting structure after forming the trench 207 in the method in accordance with Embodiment 2. As illustrated, after the trench 207 is formed by the above described photolithographic and etching processes and prior to the subsequent ashing and wet cleaning processes, the TaN layer 203 is still covered by the DARC layer 204, the BARC layer 205 and the photoresist 206.

With the trench 207 formed, the intensified ashing and wet cleaning processes are performed on the MEMS device 200. The intensified ashing process can accelerate the peeling of the BARC layer 205 and the photoresist 206 and may be conducted with a mixture of $CF_4$ with a concentration of 40 sccm and $O_2$ with a concentration of 1500 sccm introduced at a temperature of 80° C., to 130° C. In the process, the DARC layer 204 covering the TaN layer 203 can block the photoresist 206 from reacting with the underlying TaN layer 203 to produce tantalum-containing polymeric substances. Therefore, there is no such substance generated throughout the whole ashing process.

FIG. 9 shows a resulting structure after the completion of the ashing and wet cleaning processes in the method in accordance with Embodiment 2. As illustrated, without the blocking of tantalum-containing polymeric substances, the DARC layer 204 is smoothly stripped away after the removal of the BARC layer 205 and the photoresist 206. Further, due to the protection from the overlying DARC layer 204, the TaN layer 203 is not affected by the ashing process and the trench 207 thus maintains its width.

Practical tests have proven that the width of the trench 207 formed by the method in accordance with Embodiment 2 is also controlled in the range of 0.2 μm to 0.5 μm, which meets the requirement.

The method in accordance with this embodiment differs from that described in Embodiment in that a BARC layer is additionally formed on the DARC layer prior to the application of the photoresist and after the formation of the DARC layer. As described above, addition of the DARC layer between the DARC layer and the photoresist enables precise control over the trench width and can hence contributes to performance improvement of the device being fabricated.

In summary, in the methods of the present invention, by isolating and protecting the TaN layer by forming thereon a CVD-formed DARC layer, during the ashing process, the trench will not be broadened and the TaN layer will be prohibited from reacting with the photoresist to produce tantalum-containing polymeric substances which will cover the to-be-removed photoresist, DARC layer and BARC layer overlying the DARC layer. Therefore, all of the photoresist, BARC layer and DARC layer can be removed successfully during the ashing and wet cleaning processes without any residue of them, thus resulting in an improvement in the performance of the MEMS device.

While several preferred embodiments have been illustrated and described above, it should be understood that they are not intended to limit the invention in any way. It is also intended that the appended claims cover all variations and modifications made in light of the above teachings by those of ordinary skill in the art.

What is claimed is:

1. A method of forming a micro-elctro-rnechanical systems (MEMS) device, comprising the following steps in the sequence set forth:
providing a substrate;
forming a tantalum nitride layer on the substrate;
forming a dielectric anti-reflective coating layer on the tantalum nitride layer;
coating a photoresist on the dielectric anti-reflective coating layer and performing a photolithographic process to form a photoresist pattern;
sequentially etching the dielectric anti-reflective coating layer and the tantalumnitride layer to form a trench by using the photoresist pattern as an etching mask; and
performing an intensified ashing process and a wet cleaning process to remove the photoresist pattern and the dielectric anti-reflective coating layer, wherein the dielectric anti-reflective coating layer prevents the tantalum nitride layer from reacting with the photoresist to form tantalum-containing polymeric substances during the intensified ashing process, wherein the intensified ashing process is conducted with a mixture of $CF_4$ with a concentration of 40 sccm and $O_2$ with a concentration of 1500 sccm introduced at a temperature of 80°C. to 130°C.

2. The method of claim 1, wherein the dielectric anti-reflective coating layer is formed by a chemical vapor deposition process.

3. The method of claim 2, wherein the dielectric anti-reflective coating layer is formed of silicon oxynitride.

4. The method of claim 1, further comprising forming a nickel-iron layer on the substrate prior to forming the tantalum nitride layer.

5. The method of claim 4, wherein the nickel-iron layer and the tantalum nitride layer are both formed by a physical vapor deposition process.

6. A method of forming a micro-electro-mechanical systems (MEMS) device, comprising the following steps in the sequence set forth:
providing a substrate;
forming a tantalum nitride layer on the substrate;
forming a dielectric anti-reflective coating layer on the tantalum nitride layer;
forming a bottom anti-reflective coating layer on the dielectric anti-reflective coating layer;
coating a photoresist on the bottom anti-reflective coating layer and performing a photolithographic process to form a photoresist pattern;
sequentially etching the bottom anti-reflective coating layer, the dielectric anti-reflective coating layer and the tantalum nitride layer to form a trench using the photoresist pattern as an etching mask; and
performing an intensified ashing process and a wet cleaning process to remove the photoresist pattern, the bottom anti-reflective coating layer and the dielectric anti-reflective coating layer, wherein the dielectric anti-reflective coating layer prevents the tantalum nitride layer from reacting with the photoresist to form tantalum-containing polymeric substances during the intensified ashing process, wherein the intensified ashing process is conducted with a mixture of $CF_4$ with a concentration 40 sccm and $O_2$ with a concentration of 1500 sccm introduced at a temperature of 80°C. to 130°C.

7. The method of claim 6, wherein the dielectric anti-reflective coating layer is formed of silicon oxynitride.

8. The method of claim 7, wherein the dielectric anti-reflective coating layer is formed by a chemical vapor deposition process.

9. The method of claim 6, further comprising forming a nickel-iron layer on the substrate prior to forming the tantalum nitride layer.

10. The method of claim 9, wherein the nickel-iron layer and the tantalum nitride layer are both formed by a physical vapor deposition process.

* * * * *